(12) United States Patent
Vallet

(10) Patent No.: US 6,246,072 B1
(45) Date of Patent: Jun. 12, 2001

(54) INTEGRATED CIRCUIT TEST PAD

(75) Inventor: Michel Vallet, Vaulnaveys le Haut (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/193,443

(22) Filed: Nov. 17, 1998

(30) Foreign Application Priority Data

Nov. 28, 1997 (FR) .................................................. 97 15328

(51) Int. Cl.⁷ ........................ H01L 29/76; H01L 29/94; H01L 23/48
(52) U.S. Cl. .......................... 257/48; 237/691; 237/784; 237/506; 237/903; 237/211; 237/208; 237/207; 237/698; 237/700; 237/758
(58) Field of Search .................. 257/48, 784, 786, 257/700, 701, 690, 691, 774, 202–211, 506, 758, 903, 393, 698, 696

(56) References Cited

U.S. PATENT DOCUMENTS

| | | | |
|---|---|---|---|
| 4,562,455 | 12/1985 | Okumura et al. ................ | 357/71 |
| 4,901,136 | * 2/1990 | Neugebauer et al. ............ | 357/75 |
| 4,912,052 | 3/1990 | Miyoshi et al. .................. | 437/8 |
| 5,030,908 | 7/1991 | Miyoshi et al. .................. | 324/158 R |
| 5,119,169 | * 6/1992 | Kozono et al. .................. | 357/68 |
| 5,773,895 | * 6/1998 | Hassan et al. ................... | 257/774 |
| 5,818,102 | * 10/1998 | Rostoker ......................... | 257/666 |
| 5,877,551 | * 3/1999 | Tostado et al. .................. | 257/701 |
| 5,895,967 | * 4/1999 | Stearns et al. ................... | 257/691 |
| 5,903,050 | * 5/1999 | Thurairajaratnam et al. ... | 257/695 |
| 5,949,098 | * 9/1999 | Mori ................................ | 257/211 |
| 5,990,547 | * 11/1999 | Sharma et al. ................... | 257/700 |
| 6,025,616 | * 2/2000 | Nguyen et al. .................. | 257/207 |

FOREIGN PATENT DOCUMENTS

| | | | |
|---|---|---|---|
| 0 237 406 | 9/1987 | (EP) | G01R/31/28 |
| 0 473 144 | 3/1992 | (EP) | H01L/23/52 |

OTHER PUBLICATIONS

French Search Report from French Patent Application 97 15328, filed Nov. 28, 1997.
Patent Abstracts of Japan, vol. 011, No. 104 (E–494), Apr. 2, 1987 & JP–A–61 252641 (Matsushita Electronics Corp.).

* cited by examiner

*Primary Examiner*—Alexander O. Williams
(74) *Attorney, Agent, or Firm*—Wolf, Greenfield & Sacks, P.C.; James H. Morris; Theodore E. Galanthay

(57) ABSTRACT

The present invention relates to an integrated circuit test pad implemented in a surface metallization layer covered with an insulating coating. The pad is surrounded with a first metal ring made in the surface metallization layer and with a second metal ring made in a lower metallization surface, the first and second rings being electrically interconnected by at least one via and set to a fixed potential.

31 Claims, 2 Drawing Sheets

INTEGRATED CIRCUIT TEST PAD

BACKGROUND OF THE INVENTION

1. Field of the Invention

The present invention relates to the testing of integrated circuits by electron beam scanning, and more specifically to test pads that provide access to buried metallizations to measure their potential with the electron beam.

2. Discussion of the Related Art

FIG. 1 schematically illustrates the principle of electron beam scanning measurement. A surface 10 is bombarded by a beam of primary electrons $e^-_p$, the energy of which can vary from several hundred eV to some ten keV. Surface 10 then reemits several types of electrons, that is, Auger electrons, backscattered electrons, and secondary electrons. In electron beam scan tests, the reemitted secondary electrons $e^-_s$, the energy of which does not exceed 50 eV, are captured. The energy of secondary electrons has the unique property of varying according to the potential V of surface 10 at the level of the point of impact of the primary electron beam.

This principle is used in integrated circuit testing tools. It first enables an enlarged image of the surface of a chip to be obtained by scanning this surface with the electron beam. It further enables measurement of the variations of the potentials at chosen points of the chip by slightly deviating the electron beam so that it hits these points. Thereby, the variations of the potentials on surface metallizations or on surface test pads connected to buried metallizations are sampled.

FIG. 2 schematically and partially shows a cross-sectional view of an integrated circuit at the level of a conventional test pad. Test pad 12 is a metal pad, generally square-shaped, formed in the last level of metallization of the integrated circuit. Present technologies enable to obtain five metallization levels to be obtained; pad 12 is then performed in the fifth level M5. In the example of FIG. 2, pad 12 is meant to enable the measurement of the potential of a metallization 14 of third level M3.

To connect metallization 14 to pad 12, a connection pad 16 is provided in each intermediary metallization level, here level 4 only. Metallization 14 to be tested, the intermediary connection pads 16, if present, and finally test pad 12, are electrically interconnected by vias 17.

Test pad 12 is generally surrounded with many other metallizations 19 of different levels.

As is shown in FIG. 2, an integrated circuit is normally covered with an insulating and protective coating 22, generally formed of a silicon oxide layer and of a passivation layer.

This insulating coating 22 hinders the direct measurement of the potential of the surface metallizations with an electron beam.

In prior technologies greater than 0.35 μm, the potential variations of the surface metallizations can be measured by capacitive effect. Indeed, the potential variations of the surface metallizations cause, by capacitive coupling, similar potential variations, but these variations are attenuated at the external surface of insulating coating 22. These attenuated variations can thus be measured by the electron beam testing system.

However, for newer technologies less than 0.35 μm, the metallization networks are so dense, in particular metallization 19 is so close to pad 12, that the useful potential variations generated by pad 12 are drowned in the noise of the potential variations generated at the same level by the surrounding metallizations 19.

To be able to test integrated circuits implemented in recent technologies with electron beams, insulating coating 22 is removed to expose the metallizations of the last level. A direct potential measurement which is not influenced by the potentials of the surrounding metallizations can thus be performed.

This technique requires a relatively complex step of removal of insulating layer 22. Further, the removal of insulating layer 22 decreases the surface metallization capacitances, which results in an increase of the operating speed of some elements of the integrated circuit. This can make integrated circuits which have been optimized, by taking into account normal propagation times in the particular technology used, inoperative.

SUMMARY OF THE INVENTION

An object of the present invention is to provide a test pad enabling a measurement by capacitive effect in the newest technologies, less than 0.35 μm.

To achieve this and other objects, the present invention provides an integrated circuit test pad implemented in a surface metallization layer covered with an insulating coating. The pad is surrounded with a first metal ring made in the surface metallization layer and with a second metal ring made in a lower metallization surface, the first and second rings being electrically interconnected by at least one via and set to a fixed potential.

According to an embodiment of the present invention, the internal circumference of the second ring is close to the circumference of an intermediary metal pad used to connect the test pad to a lower metallization.

The present invention also aims at an integrated circuit including a test pad of the above-mentioned type.

The foregoing objects, features and advantages of the present invention will be discussed in detail in the following non-limiting description of specific embodiments made in connection with the accompanying drawings.

DETAILED DESCRIPTION

Figure 1:
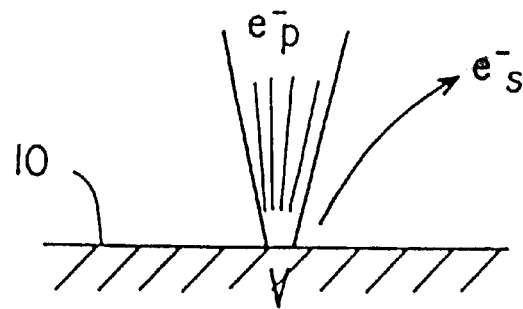
FIG. 1, previously described, is meant to illustrate the principle of the measurement of a potential with an electron beam.
Figure 2:
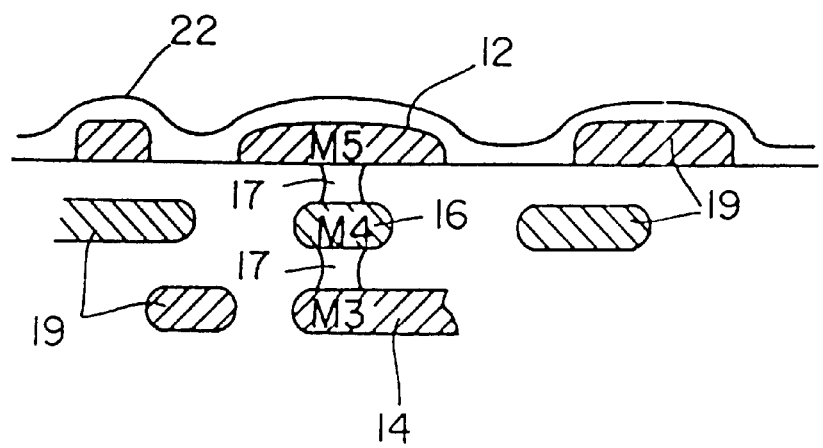
FIG. 2 shows a simplified partial cross-sectional view of an integrated circuit at the level of a conventional test pad.
Figure 3:
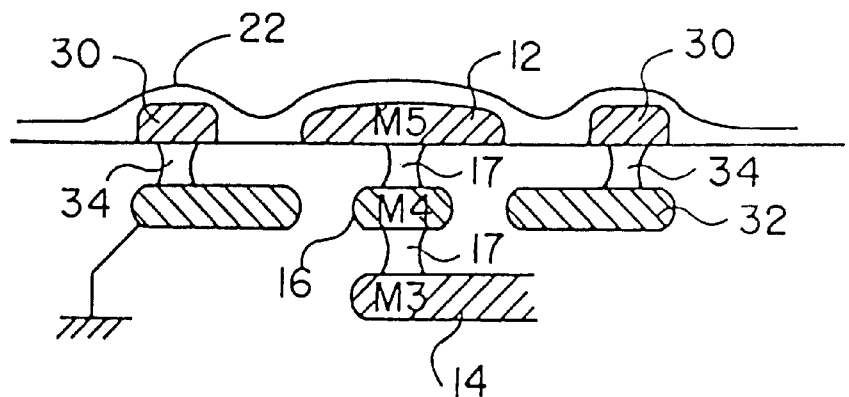
FIG. 3 shows a simplified partial cross-sectional view of an integrated circuit at the level of a test pad according to the present invention.

FIG. 3 shows a metal test pad 12 implemented in the last metallization level (M5) of an integrated circuit. Test pad 12 is conventionally connected to a buried metallization 14 to be tested by means of connection pads 16 and vias 17.

According to the present invention, pad 12 is surrounded, on the same metallization level, with a first metal ring 30. A second metal ring 32 made in the metallization level immediately under is electrically connected to ring 30 by vias 34. Rings 30 and 32 are set to a reference potential, for example, the ground, as is shown.

Rings 30 and 32 are meant to form a screen which protects the external surface of insulating layer 22 at the level of pad 12 from parasitic influences of the metallizations which surround the pad. In particular, ring 30 forms a screen against the influence of the metallizations located at the same level as pad 12, and ring 32 forms a screen against the influence of the buried metallizations.

To improve the screen effect of ring 32, its internal circumference is, as is shown, close to or substantially the same as the circumference of connection pad 16 of the same metallization level.

A test pad according to the present invention appears to occupy a larger surface than a conventional pad. In newer technologies that provide five metallization levels, this is not a disadvantage since the last two metallization levels are not often used.

Figure 4:
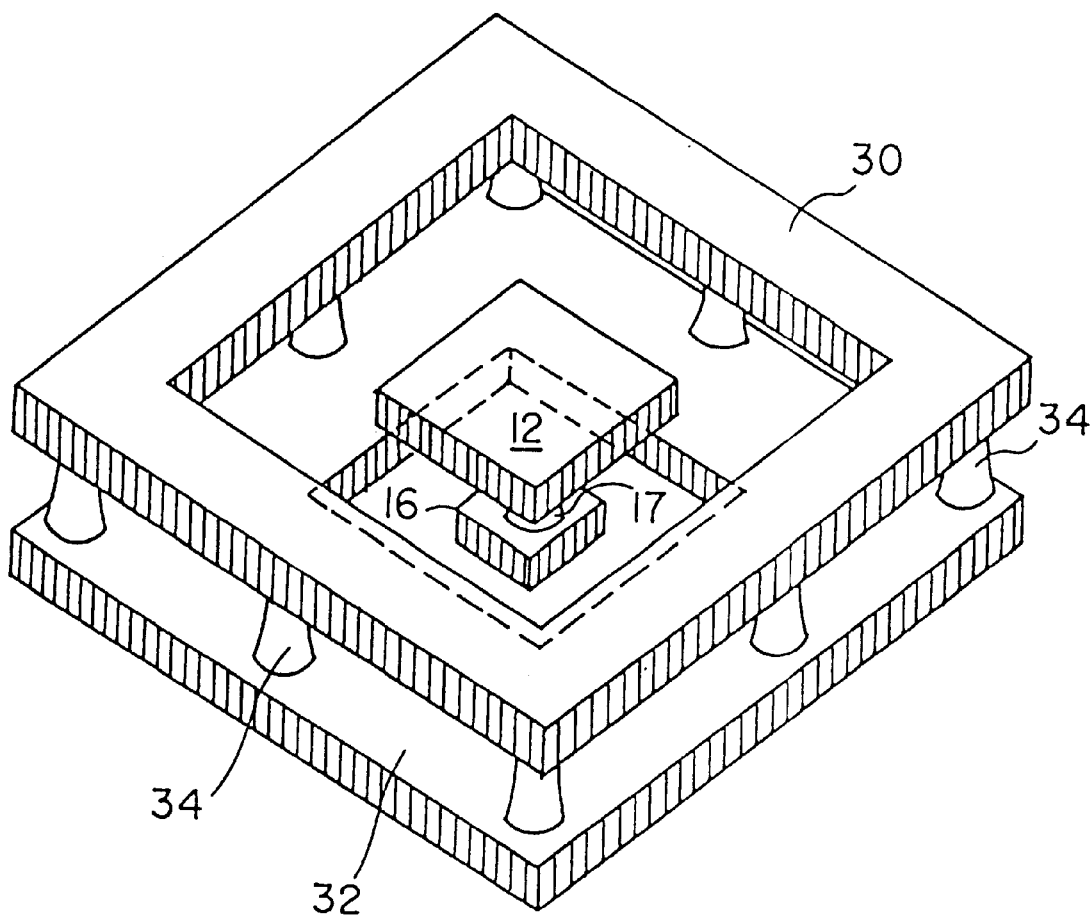
FIG. 4 shows a perspective view of a test pad according to the present invention.

FIG. 4 shows a perspective view of a test pad according to the present invention. As is shown, pad 12 and rings 30 and 32 are square-shaped. Of course, any other shape is suitable, for example, a circular shape. In FIG. 4, it can be seen that vias 34 are regularly distributed between rings 30 and 32. A Faraday cage, enhancing the screen effect, is thus made.

Of course, the present invention is likely to have various alterations, modifications, and improvements which will readily occur to those skilled in the art. For example, if a metallization to be tested is located in the same metallization level as ring 32, ring 32 can be open to enable the passing of the metallization to be tested to the center of the ring. Ring 32 could also be made in a lower metallization level.

Such alterations, modifications, and improvements are intended to be part of this disclosure, and are intended to be within the spirit and the scope of the invention. Accordingly, the foregoing description is by way of example only and is not intended to be limiting. The invention is limited only as defined in the following claims and the equivalent thereto.

What is claimed is:

1. An integrated circuit test pad implemented in a surface metallization layer covered with an insulating coating, surrounded with a first metal ring made in the surface metallization layer and with a second metal ring made in a lower metallization surface, the first and second rings being electrically interconnected by at least one via and set to a fixed potential.

2. The test pad of claim 1, wherein the internal circumference of the second ring is close to the circumference of an intermediary metal pad used to connect the test pad to a lower metallization.

3. An integrated circuit including the test pad of claim 1.

4. An integrated circuit including the test pad of claim 2.

5. The test pad of claim 1, wherein said first metal ring is square-shaped.

6. The test pad of claim 5, Wherein said second metal ring is square-shaped.

7. The test pad of claim 6, wherein both said first and second metal rings have the same size square-shape.

8. The test pad of claim 7, wherein said first metal ring directly overlies said second metal ring.

9. The test pad of claim 8, wherein said at least one via includes a plurality of vias extending between said rings in a generally perpendicular direction to said rings.

10. The test pad of claim 1, wherein said rings, in combination with said at least one via, form a screen which protects the external surface of the insulating coating at the level of the test pad, from parasitic influences of the metallization which surround the text pad.

11. The test pad of claim 10, wherein the first ring forms a screen against the influence of the metallization located at the same level as the text pad.

12. The test pad of claim 11, wherein the second ring forms a screen against the influence of the buried metallizations.

13. The test pad of claim 1, wherein said first metal ring is circular-shaped.

14. The test pad of claim 13, wherein said second metal rings is circular-shaped.

15. The test pad of claim 14, wherein both said first and second metal rings have the same size circular-shape.

16. The test pad of claim 15, wherein said first metal ring directly overlies said second metal ring.

17. The test pad of claim 1, wherein both said first and second metal rings are the same size.

18. The test pad of claim 17, wherein said first metal ring overlies said second metal ring.

19. The test pad of claim 18, The test pad of claim 1, wherein said rings, in combination with said at least one via, form a screen which protects the external surface of the insulating coating at the level of the test pad, from parasitic influences of the metallization which surround the text pad.

20. The test pad of claim 19, wherein the first ring forms a screen against the influence of the metallization located at the same level as the text pad.

21. The test pad of claim 20, wherein the second ring forms a screen against the influence of the buried metallizations.

22. The test pad of claim 9, wherein said at least one via includes a plurality of vias extending between said rings in a generally perpendicular direction to said rings.

23. The test pad of claim 22, wherein said rings, in combination with said at least one via, form a screen which protects the external surface of the insulating coating at the level of the test pad, from parasitic influences of the metallization which surround the text pad.

24. In an integrated circuit, a test pad apparatus comprising, a surface metallization layer, a test pad implemented in said surface metallization layer, an insulating coating disposed over said surface metallization layer, a first metal ring made in the surface metallization layer, said first metal ring surrounding said test pad, a lower metallization layer, a second metal ring made in the lower metallization layer and underlying the first ring, at least one via electrically interconnecting said first and second rings, and a fixed potential applied to said first and second rings, said metal rings forming about said test pad a screen which protects the outer surface of the insulating coating at the level of the test pad from parasitic influences of the metallizations which surround the test pad.

25. The test pad apparatus of claim 24, wherein the integrated circuit further includes a buried metallization layer to be tested, said buried metallization layer being disposed below said lower metallization layer.

26. The test pad apparatus of claim 25, including a connection pad disposed in said lower metallization layer and surrounded by said second metal ring.

27. The test pad apparatus of claim 26, wherein said buried metallization layer includes a buried metallization.

28. The test pad apparatus of claim 27, including vias for electrically connecting said test pad, said connection pad, and said buried metallization.

29. The test pad apparatus of claim 28, wherein said first metal ring directly overlies said second metal ring and wherein said at least one via comprises a plurality of vias extending between said rings in a generally perpendicular direction to said rings so as to form said screen.

30. The test pad apparatus of claim 29, wherein said metal rings are square-shaped.

31. The test pad apparatus of claim 29, wherein said metal rings are circular-shaped.

* * * * *